United States Patent
Brauch et al.

[19]
[11] Patent Number: 5,862,278
[45] Date of Patent: Jan. 19, 1999

[54] LASER SYSTEM

[75] Inventors: Uwe Brauch, Stuttgart; Helmut Huegel, Sindelfingen; Hans Opower, Krailling; Adolf Giesen, Renningen, all of Germany

[73] Assignees: Deutsche Forschungsanstalt fuer Luftund Raumfahrt e.V., Bonn; Universitaet Stuttgart Institut fuer Strahlwerkqeuge, Stuttgart, both of Germany

[21] Appl. No.: 784,110

[22] Filed: Jan. 15, 1997

[30] Foreign Application Priority Data

Jan. 29, 1996 [DE] Germany .......................... 196 03 111.7

[51] Int. Cl.⁶ ..................................... G02B 6/32
[52] U.S. Cl. ................................. 385/34; 385/35; 385/119
[58] Field of Search ....................... 385/33–35, 116–119, 385/88–93; 372/75, 71, 101

[56] References Cited

U.S. PATENT DOCUMENTS

| | | | |
|---|---|---|---|
| 4,713,822 | 12/1987 | Lee | 372/75 |
| 4,962,988 | 10/1990 | Swann | 385/34 |
| 5,276,758 | 1/1994 | Hughes | 385/116 |
| 5,369,661 | 11/1994 | Yamaguchi et al. | 372/69 |
| 5,506,857 | 4/1996 | Meinzer | 375/55 |
| 5,518,863 | 5/1996 | Pawluczyk | 385/33 |
| 5,642,449 | 6/1997 | Phillips | 385/33 |

FOREIGN PATENT DOCUMENTS

| | | |
|---|---|---|
| 32 14 042 | 10/1983 | Germany . |
| 32 30 152 | 2/1984 | Germany . |
| 41 05 989 | 8/1992 | Germany . |
| 42 43 057 | 7/1993 | Germany . |
| WO 94/17575 | 8/1994 | WIPO . |
| WO 94/17576 | 8/1994 | WIPO . |

*Primary Examiner*—Hemang Sanghavi
*Attorney, Agent, or Firm*—Barry R. Lipsitz; Ralph F. Hoppin

[57] ABSTRACT

In order to improve a laser system comprising several laser radiation sources, each of which generates laser radiation which is coupled into a first end of a respective optical single-mode fiber, wherein all optical single-mode fibers form a fiber bundle and have second ends lying at a fiber bundle end, the laser radiation exiting from the second ends and thereby forming a total laser radiation field, and further comprising an optical transformation means which transforms the total laser radiation field onto an object, such that a focal point with a highest possible power per area and per solid angle can be generated therewith, it is proposed that the optical transformation means comprise a collimating element which collimates the laser radiation exiting divergently from each individual second end of the single-mode fibers and forms a collimated radiation bundle therefrom, and that the optical transformation means comprise a focusing element which images the collimated radiation bundle as a whole onto a focal point.

25 Claims, 5 Drawing Sheets

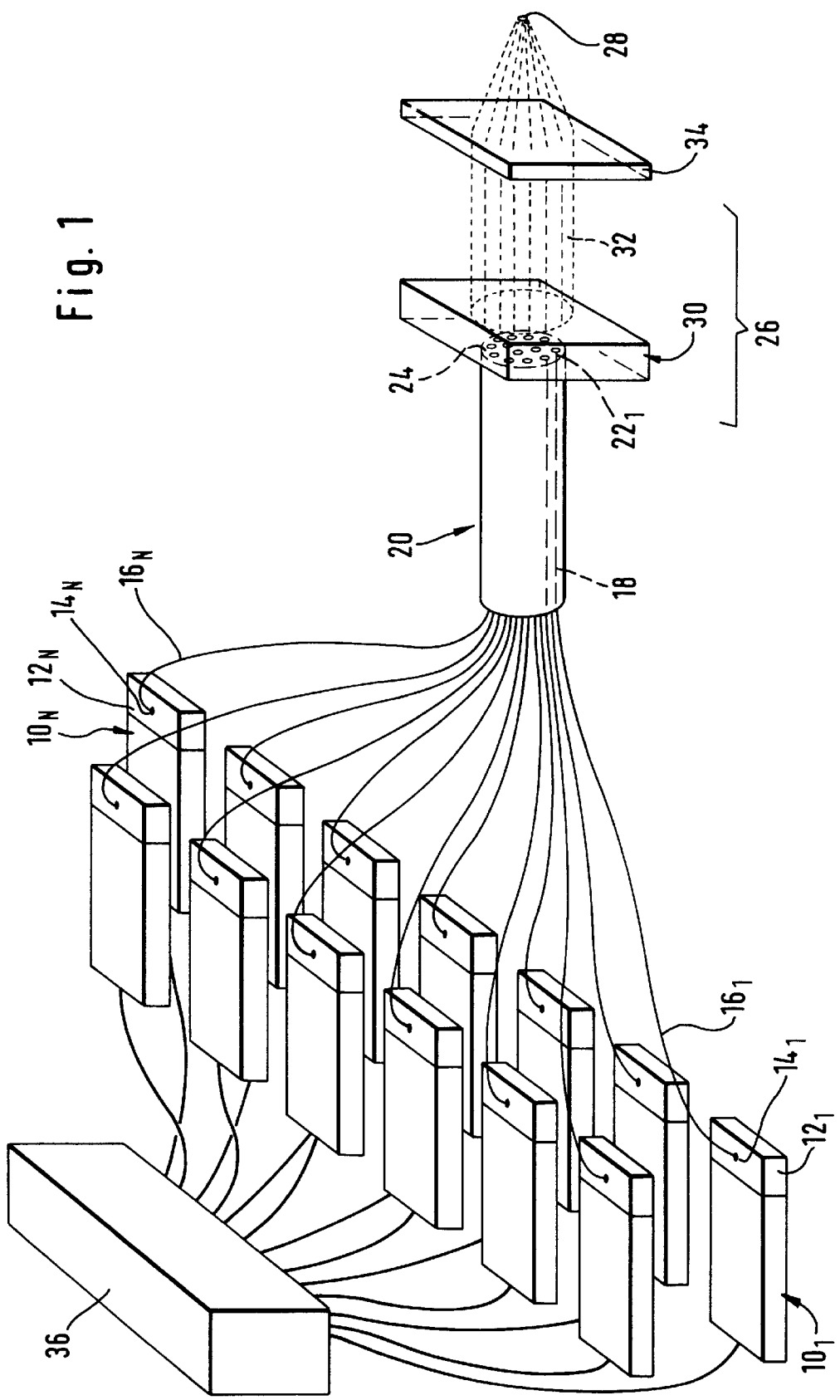

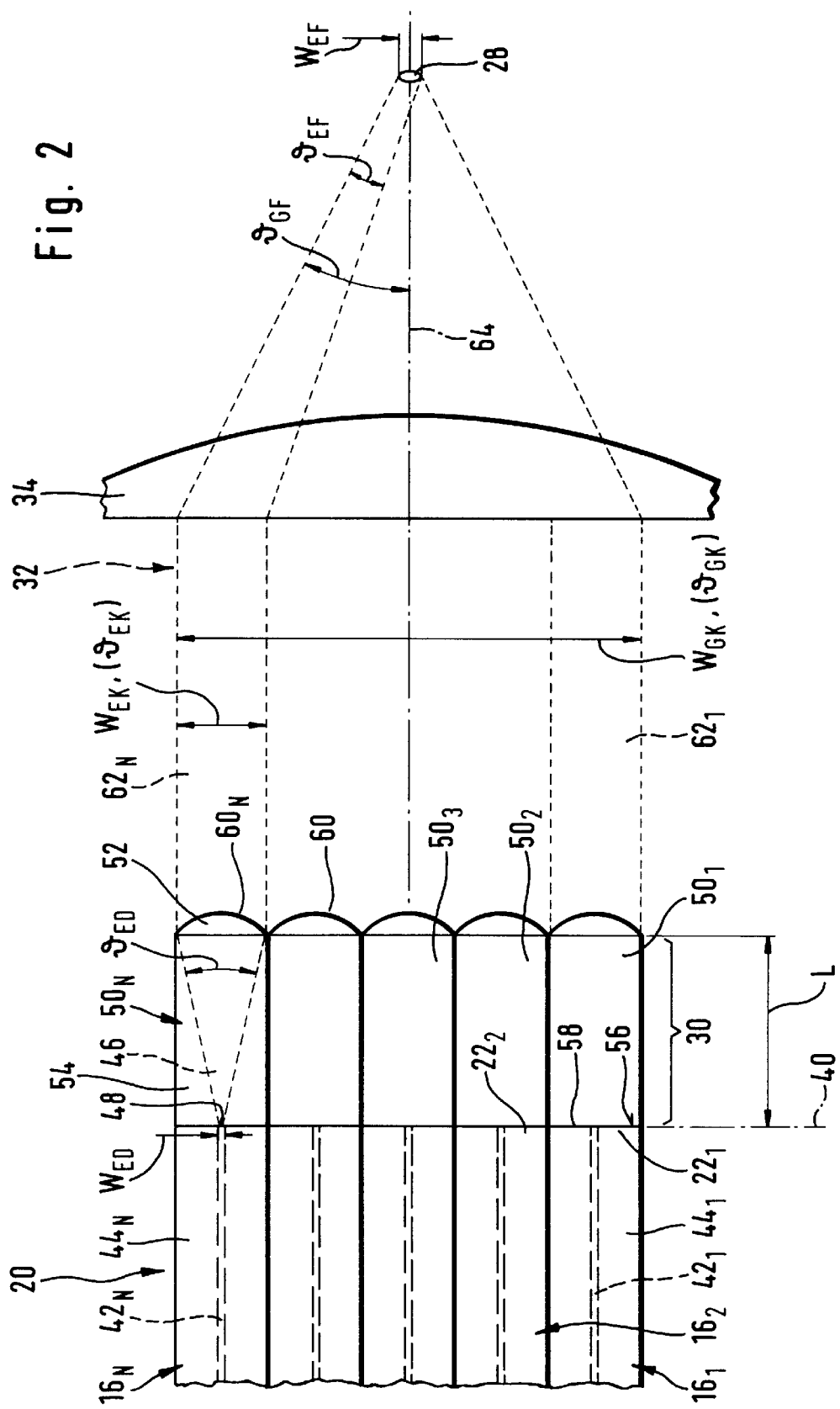

LASER SYSTEM

BACKGROUND OF THE INVENTION

The invention relates to a laser system comprising several laser radiation sources, each of which generates laser radiation which is coupled into a first end of a respective optical single-mode fiber, wherein all optical single-mode fibers form a fiber bundle and have second ends lying at a fiber bundle end, the laser radiation exiting from the second ends, thereby forming a total laser radiation field, and further comprising an optical transformation means which transforms the total laser radiation field onto an object.

Such laser systems are known, for example, from WO 94/17575 or WO 94/17576.

In these known laser systems, the optical transformation means is an optical imaging means which images the second ends of the single-mode fibers into an imaging plane onto an object.

The problem herein is that the single-mode fibers have a core and a sheathing and, therefore, the spacings between the individual cores from which the laser radiation finally exits are large. If, as described in the publications mentioned hereinabove, an optical imaging means is used as optical transformation means, with this optical imaging means only the locations at which the laser radiation exits at the fiber bundle end can be transformed onto the image plane as points likewise lying alongside one another.

The obtainable power density is, therefore, limited and so the advantage of these known solutions, namely that of generating a highest possible laser power by a plurality of individual laser radiation sources and uniting their laser radiation to a total laser radiation field, cannot be exploited to the full extent.

The object of the invention is, therefore, to so improve a laser system of the generic kind that a focal point with a highest possible brightness, i.e., power per area and per solid angle, can be generated therewith.

SUMMARY OF THE INVENTION

This object is accomplished in accordance with the invention in a laser system of the kind described at the outset in that the optical transformation means comprises a collimating element which collimates the laser radiation exiting divergently from each individual second end of the single-mode fibers and forms a collimated radiation bundle therefrom, and in that the optical transformation means comprises a focusing element which images the collimated radiation bundle as a whole onto a focal point.

The advantage of the inventive solution is to be seen in the fact that the collimating element makes it possible, in spite of the considerable spacing between locations at which the laser radiation exits at the fiber bundle end, owing to the expansion of the laser beam by the collimating element, to create a collimated radiation bundle in which, with lower beam divergence, the spaces between the individual collimated laser beams are smaller than the spaces between the locations at which the laser radiation exits at the fiber bundle end and so the collimated laser beams in the collimated fiber bundle lie as close together as possible and the collimated fiber bundle, therefore, exhibits a high filling factor. Such a collimated fiber bundle can then be focused onto a single focal point with the focusing element, and the single focal point represents a superimposition of all focal points which can be generated by focusing each individual collimated laser beam. Owing to the focal points being essentially superimposed, the desired higher power density can be achieved.

In the case of incoherently radiating individual single-mode fibers, a power density per area and per solid angle which corresponds to the power density per area and per solid angle in an individual single-mode fiber can be achieved in the focal point.

The precondition thereof is that the collimating element and the focusing element constitute diffraction-limited optics.

Owing to the constant product of radiation diameter and angle of divergence with diffraction-limited optics, it is necessary—in order to obtain a focal point with a smallest possible diameter with a specified angle of divergence—to choose the diameter of the individual collimated laser beams in the collimated radiation bundle as large as possible, and, on the other hand, to keep as low as possible the diameter of the collimated radiation bundle which is then decisive for the total convergence angle in the focusing. In particular, this can be achieved by the individual collimated laser beams in the collimated total radiation bundle lying so close together that they essentially almost touch one another.

In the case of coherent, collimated laser beams forming the collimated radiation bundle, it is also desirable to achieve a total laser radiation field which is as homogeneous as possible and which can then be focused onto a focal point. In the ideal case, the radiation density in the focal point can then be increased by a factor N, N being the number of combined laser radiation sources, since, in this case, the diameter of the focal point is determined by the convergence angle during the focusing of the total coherent collimated radiation bundle, whereas in the case of incoherent, collimated laser beams forming the collimated radiation bundle, the diameter of the focal point is determined by the convergence angle during the focusing of each individual collimated laser beam.

In the present invention, the collimated radiation bundle can be focused particularly advantageously when all collimated laser beams forming the collimated radiation bundle have essentially the same diameter and essentially the same divergence.

In order to achieve as stable relations as possible in the alignment of the individual second ends of the single-mode fibers relative to the collimating element, provision is preferably made for the collimating element to be fixedly connected to each individual single-mode fiber.

This can, for example, be achieved by the single-mode fiber being held in a sleeve close to the second end and by the sleeve being connected to the collimating element.

In this case, however, there is often an adjustment inaccuracy between the second end and the collimating element. For this reason, provision is advantageously made for the second end of each single-mode fiber to rest with an end face against the collimating element so a defined position of the second end relative to the collimating element is achieved by its contacting the collimating element.

In order to obtain a defined collimation for the laser radiation from each individual single-mode fiber, provision is preferably made for the collimating element to have for each second end a collimating optical means of its own. This means that each second end has a collimating optical means of its own associated therewith and the collimating element comprises all collimating optical means for all second ends of the single-mode fibers.

The collimating optical means itself can vary greatly in design. It is, for example, conceivable for the collimating optical means to comprise an optical lens.

On the other hand, it is also conceivable for the collimating optical means to be designed as a so-called GRIN optical means or a diffractive optical means.

Use of an optical lens means or a GRIN optical means or a diffractive optical means is, however, not to be regarded as alternatives which exclude one another. In a particularly expedient solution, provision is made for the collimating optical means to comprise a combined optical means consisting of an optical lens means and/or a GRIN optical means and/or a diffractive optical means, as, in this case, it is possible to compensate the errors of the one optical means by the other optical means.

To enable a collimated laser beam with a largest possible diameter to be generated with each collimating optical means, provision is advantageously made for each collimating optical means to generate a collimated laser beam which essentially corresponds to an outer diameter of the respective collimating optical means. This means that the collimating optical means is designed such that its outer diameter is essentially limited by a diameter of the collimated laser beam. This is important, in particular, in all of the embodiments in which a collimated radiation bundle, the individual collimated laser beams of which have a smallest possible spacing from one another and preferably extend essentially almost adjacent to one another in the collimated radiation bundle, is to be generated.

The design of the collimating optical means will now be discussed in greater detail. In an advantageous embodiment, provision is made for each collimating optical means to comprise a single optical element. In this case, the collimating optical means can be produced in a simple way for each second end of each single-mode fiber and also adjusted in a simple way relative to the end of the single-mode fiber.

In the case of single optical elements, in order to position these as exactly as possible relative to one another, but, on the other hand, to also arrange the single optical elements as closely together as possible, in order to obtain smallest possible spacings in the collimated radiation bundle between the collimated laser beams generated by the single optical elements, provision is preferably made for the collimating element to comprise a carrier means which extends over the entire cross section of the radiation bundle and by means of which the single optical elements are positioned in a defined manner relative to one another.

In a preferred solution, provision is made for the carrier means to comprise a one-piece, light-permeable plate which positions the single optical elements in a defined manner relative to one another and so exact alignment of the single optical elements relative to one another can be determined by the carrier means.

This can be achieved in an advantageous way by, for example, the single optical elements resting with their end face against the carrier means, with the contact surface provided for the single optical elements on the carrier means determining an exact alignment of the single optical elements relative to one another.

Herein it is particularly expedient for the carrier means to not only align the single optical elements but for the carrier means to also carry the single optical elements. This can be achieved in an advantageous way, for example, by the single optical elements being joined, for example, adhesively, via their end face to a contact surface on the carrier means.

The type of connection between the second ends of the single-mode fibers and the collimating element comprising a carrier means was not discussed in further detail in the above explanation of this embodiment. In an advantageous solution, provision is made for the second ends of the single-mode fibers to rest with their end faces against the carrier means so that the position of the second end relative to the single optical means is defined by the carrier means.

As an alternative to this, provision is made for the second ends of the single-mode fibers to rest with their end faces against an end face of the single optical elements and for the single optical elements to rest with their other end face against the carrier means. In this solution, the relative orientation between the end of each single-mode fiber and the single optical element is thus determined by the direct contact between these, while the carrier means merely ensures correct positioning of the single optical elements relative to one another.

As an alternative to provision of a carrier means, provision is made in a further inventive solution for the collimating element to be formed by a plurality of single optical elements connected to one another. In this case, there is no necessity for provision of a carrier means as the single optical elements themselves form a coherent unit.

This is preferably accomplished—in particular, in order to achieve smallest possible spacings between the collimated laser beams in the collimated radiation bundle—by the single optical elements being joined together in the area of their circumferential surfaces, with the connection being effected, for example, by an embedding material or adhesive substance.

Furthermore, the connection between the second ends of the single-mode fibers and the single optical elements is made by the second ends resting with their end faces at an end face of the single optical elements.

In all embodiments using single optical elements, in order to keep the spacings between the collimated laser beams in the collimated radiation bundle as minimal as possible, provision is preferably made for the single optical elements to rest with their respective outer contour against one another. In the simplest case, the single optical elements have a round outer contour. In this case, optimally close arrangement of the single optical elements is then achieved by the single optical elements being oriented in an extremely dense, hexagonal form.

To enable arrangement of the single optical elements, on the one hand, as compactly as possible, but, on the other hand, in particular, in the case of a collimating element without a carrier means, in order to join the single optical elements as optimally as possible, and yet to provide a largest possible cross section for the exiting collimated laser radiation, provision is made for the single optical elements to have a hexagonal outer contour so that they can be set against one another essentially without spaces and thus produce an extremely dense, hexagonal package.

In a further embodiment of an inventive solution, provision is made for the collimating element to be of one-piece design and to form for each second end a collimating optical means of its own, but which is integrated in the one-piece collimating element.

This collimating optical means can be a GRIN optical means, an optical lens means or a diffractive optical means, and, in the last-mentioned case, a surface of the collimating element is to be shaped in accordance with the desired lens effect.

In all embodiments, it is preferable, in the case where the end face of the second end of the single-mode fiber rests against the collimating element, for example, at the carrier means or the single optical element or the collimating element of one-piece design, and in the case where the single optical element rests against the carrier means, for the transition from one element to the other to occur in an essentially reflection-free manner, i.e., either the one element continues directly into the other or they directly adjoin one another or antireflection coatings are provided or a medium adapting the refractive index, whether it be a liquid, an adhesive substance or a cementing agent, is provided between both elements.

In a further, particularly advantageous embodiment in which single optical elements are used, it is also conceivable to form the single optical elements by continuation of the single-mode fiber without a core and to optionally provide these with an optical lens means so that, in this case, the single optical elements are integrally connected to the single-mode fiber, and, for example, in a special variant of this embodiment, differ from the single-mode fiber in that the core is missing, which is, for example, achievable by diffusion processes.

A further advantage of the inventive solution is to be seen in the possibility of freely selecting the spacing between the single-mode fibers, at least within limits, and of arranging the single-mode fibers in the area of the fiber bundle end with their circumferential surfaces contiguous to one another or also at a spacing from one another, in order, for example, owing to the spacing between the individual single-mode fibers, to have the possibility of cooling these.

Further features and advantages of the invention are set forth in the following description and the appended drawings of several embodiments.

BRIEF DESCRIPTION OF THE DRAWINGS

FIG. 1 a schematic representation of a laser system according to the invention;

FIG. 2 an optical transformation means according to the invention with a first embodiment of a collimating element;

DETAILED DESCRIPTION OF THE INVENTION

Figure 4:
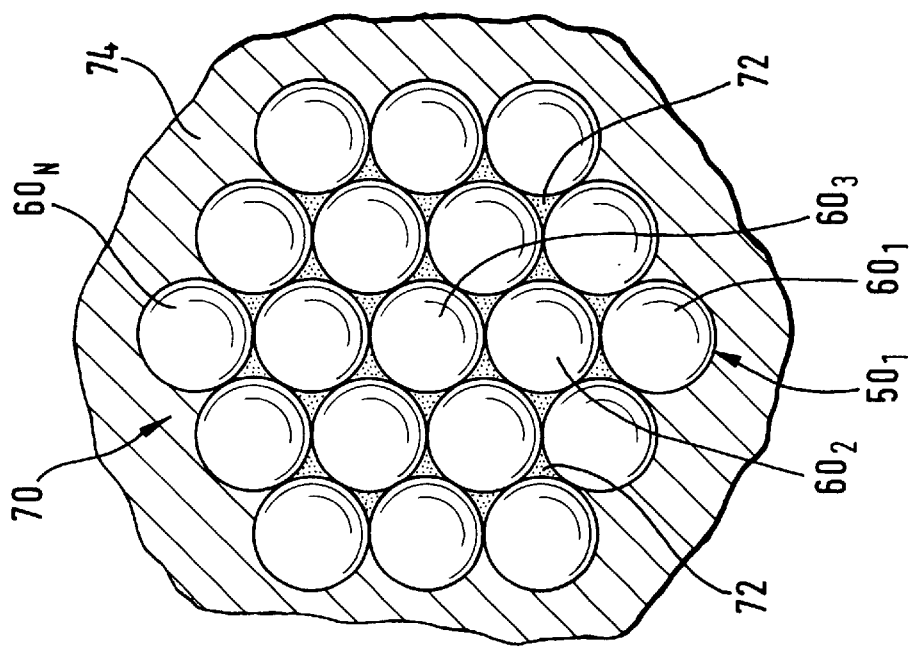
FIG. 4 a plan view in the direction of arrow A in FIG. 3 with a part representation of the mounting of the collimating element.

An embodiment of a laser system according to the invention, illustrated in FIG. 1, comprises a plurality of laser radiation sources $10_1$ to $10_N$, for example, a plurality of semiconductor lasers, each of which generates laser radiation, which by means of a coupling unit $12_1$ to $12_N$, each associated with an individual laser radiation source 10, can be respectively coupled into a first end 14 of an optical single-mode fiber 16.

All of the single-mode fibers 16 lead away from the individual coupling units 12 and form with their end regions 18 remote from the first end 14 a fiber bundle, designated in its entirety 20, and second ends 22 of the individual single-mode fibers 16 together form a fiber bundle end 24.

The second ends 22 preferably lie in a common plane which then also corresponds to the plane formed by the fiber bundle end 24.

The laser radiation exiting from each individual second end $22_1$ to $22_N$ is focused by an optical transformation means 26 according to the invention onto a focal point 28 which forms the location at which the desired effect of the laser radiation is essentially exploited for the respective laser application.

The optical transformation means 26 comprises a collimating element 30, which is arranged so as to follow on the fiber bundle end 24 and forms a collimated radiation bundle 32 comprised of the laser radiation from all second ends $22_1$ to $22_N$. This collimated radiation bundle 32 then impinges on a focusing element 34 which focuses the collimated radiation bundle onto the focal point 28.

All laser radiation sources 10 are preferably driven by a common control means 36 which supplies the laser radiation sources 10, for example, in the case of semiconductor lasers, with the necessary power and also controls their operation.

Preferably—for reasons of simplest possible design of the laser system—the individual laser radiation sources 10 are not coupled to one another with respect to the generated laser radiation, but rather each laser radiation source 10 generates the laser radiation independently of the other laser radiation sources 10.

As shown in part representation in FIG. 2, the second ends 22 of the single-mode fibers 16 preferably lie in the common plane 40 which is simultaneously the plane defined by the fiber bundle end 24.

FIG. 2 also shows that each single-mode fiber 16 comprises a core 42 and a sheathing 44 surrounding this core 42, and the laser radiation is guided through the core 42 of the single-mode fiber 16.

Therefore, at the second end 22 of the respective single-mode fiber 16, laser radiation exits in the form of a divergent radiation cone 46 from each individual surface 48 of each individual core 42.

As FIG. 2 also shows, a first embodiment of a collimating element 30 comprises a plurality of single optical elements $50_1$ to $50_N$, and each single optical element 50 comprises an optical lens 52 as collimating optical means.

Each single optical element 50 is preferably made up of a cylindrical fiber piece 54 having a diameter which at least corresponds to or is larger than the diameter of the single-mode fiber 16. Such a cylindrical fiber piece 54 is placed at each end 22 of a single-mode fiber 16 in such a way that its end face 56 facing the second end 22 of the single-mode fiber 16 rests essentially surface-to-surface against an end face 58 of the respective single-mode fiber 16 forming the second end 22 and is optionally either welded or adhesively bonded to the end 22 so that an essentially reflection-free optical contact exists between the material of the cylindrical fiber piece 54 and the end face 48 of each core 42 so the laser radiation passes essentially reflection-free from the core 42 into the cylindrical fiber piece 54 and propagates in a divergent manner therein in the form of the divergent radiation cone 46.

In the case of the cylindrical fiber piece 54, the optical lens 52 is formed preferably essentially integrally on the fiber piece 54 on the side opposite the end face 56 thereof so the cylindrical fiber piece 54 has a surface 60 curved approximately in the shape of a spherical cap on its side opposite the end face 56.

A length L, which corresponds to a spacing of the optical lens 52 from the end face 56, is selected such that the divergent radiation cone 46, starting from the end face 56, has expanded to such an extent on reaching the optical lens 52 that it attains approximately the diameter of the cylindrical fiber piece 54, and the optical lens 52 likewise having this diameter is thus capable of converting the laser radiation from the divergent radiation cone 46 into a collimated individual laser beam 62, and the sum of all collimated laser beams $62_1$ to $62_N$ together forms the collimated radiation bundle 32.

Each collimated laser beam 62 propagates as far as the focusing element 34, which is, for example, a collecting lens detecting the entire collimated radiation bundle 32 and, therefore, focuses each individual collimated laser beam $62_1$ to $62_N$ onto the focal point 28, which, for reasons of simplicity, lies on an optical axis 64 representing an axis of symmetry of the collimated radiation bundle 32.

Figure 3:
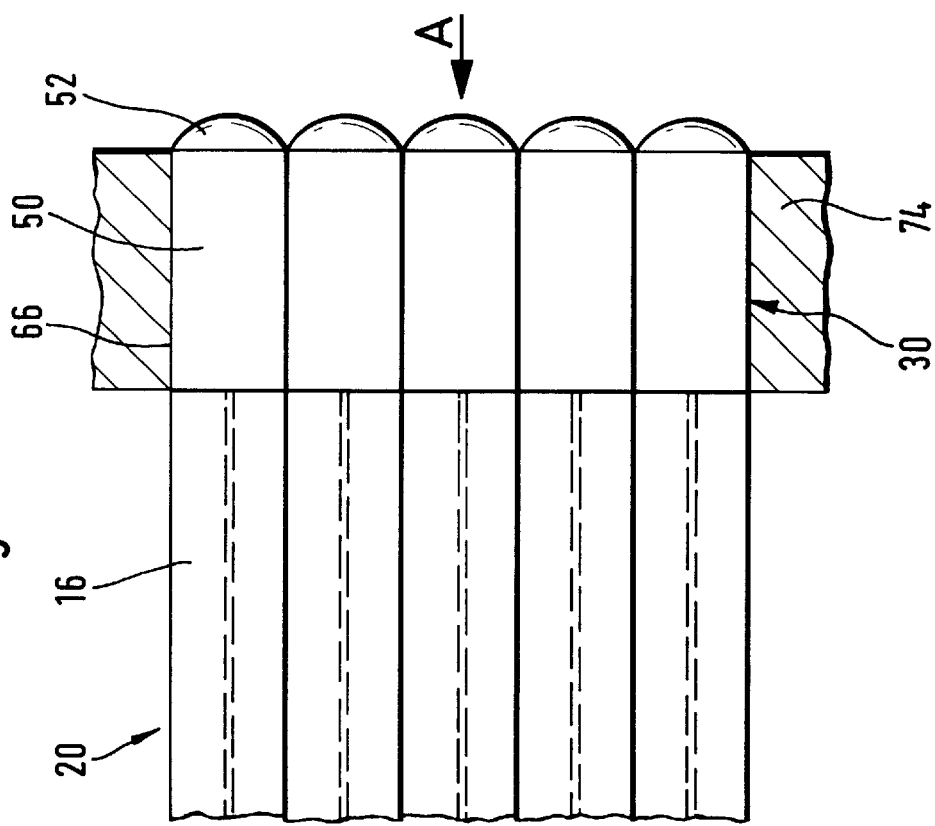
FIG. 3 a representation of the first embodiment of the collimating element, similar to FIG. 2, and a mechanical mounting thereof.
Figure 5:
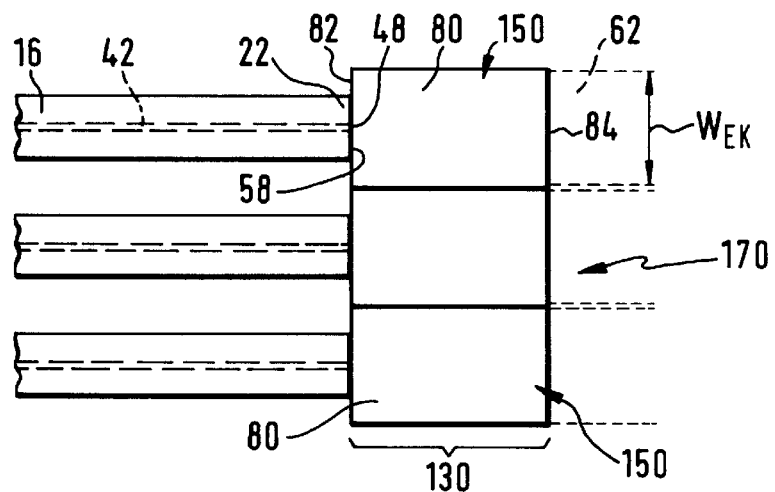
FIG. 5 a view, similar to FIG. 2, of a second embodiment of the collimating element.

As the comparison in FIGS. 3 and 4 shows, the single optical elements are arranged in the form of an extremely dense hexagonal package, with outer circumferential surfaces 66 of the single optical elements 50 preferably lying contiguously against one another and all of the single optical elements $50_1$ to $50_N$ forming a coherent unit 70 by the cylindrical fiber pieces 54 being bonded, for example, adhesively, to one another in the area of the spaces 72 formed therebetween.

The entire unit 70 is then accommodated in a mounting 74 which is for precise mechanical positioning of the collimating element 30 relative to the focusing element 34.

As an alternative to this, it is also possible to provide cylindrical fiber pieces 54 with a hexagonal outer contour instead of the circular-cylindrical outer circumferential surfaces 66, so that on account of their cross section, the cylindrical fiber pieces 54 can lie surface-to-surface against one another in the form of a regular hexagon and their surfaces can, for example, be adhesively bonded to one another.

The advantage of the single optical elements 50 lying close together is that the collimated laser beams $62_1$ to $62_N$ in the collimated radiation bundle 32 also lie almost contiguously against one another and, therefore, a total cross-sectional area of the collimated radiation bundle 32 determining the total beam diameter $W_G$ is insignificantly larger than the sum of all cross-sectional areas of all collimated laser beams $62_1$ to $62_N$ with the diameter $W_E$.

Furthermore, both the collimating element 30 and the focusing element 34 are designed such that they form diffraction-limited optics so the laws of Gaussian optics apply. As a result of this, the product of beam diameter $W_G$ times angle of divergence θ is always a constant and at best can be maintained by the respective optical elements.

If the laser radiation of a single laser radiation source exiting from the end surface 48 of each individual core 42 is considered, it then applies for the divergent radiation cone 46 that the angle of divergence $θ_{ED}$ multiplied by the diameter $W_{ED}$ of the end surface 48 is equal to the product of the diameter $W_{EK}$ of the collimated laser beam 62 times the angle of divergence $θ_{EK}$ and is equal to the product of the diameter of the focal point $W_{EF}$ times the convergence angle $θ_{EF}$.

Furthermore, the product of the diameter of the focal point $W_{EF}$ and the convergence angle $θ_{GF}$ for the total radiation converging towards the focal point is equal to the product of the diameter $W_{GK}$ of the collimated radiation bundle 32 times the angle of divergence $θ_{GK}$ thereof. If the power available in the focal point 28 is to be increased by a largest possible number of laser radiation sources 10 whose laser radiation is united by single-mode fibers 16 being used, then the power in the focal point 28 can be increased by approximately the same factor by which the product of $W_{GK}$ times $θ_{GK}$ increases when the individual collimated laser beams $62_1$ to $62_N$ lie as closely together as possible and essentially no spaces remain between them. For this reason, the single optical elements 50 are preferably arranged such that the collimated laser beam 62 generated by each individual single optical element 50 extends alongside, if possible, touching, the next adjacent laser beam 62 in the collimated radiation bundle 32.

However, this does not constitute a limitation for the diameter of the single optical elements 50. If it is chosen so as to be larger than that of the single-mode fibers 16, then the product $W_{GK}$ times $θ_{GK}$ in the collimated radiation bundle 32 is still the same if the collimated laser beams $62_1$ to $62_N$ lie as closely as possible alongside one another in the manner described hereinabove.

In a second embodiment of a collimating element 130, a so-called GRIN lens is respectively provided as single optical element 150. The GRIN lens has a cylindrical body 80 within which the refractive index varies in the radial direction so the laser radiation is expanded and collimated in the GRIN lens. Such GRIN lenses, also called graded-index rod lenses, are available, for example, from the Newport company, for example, in the form of a kit designated F-GRK 1.

The cylindrical body 80 has an end face 82 which faces the single-mode fiber 16 and with which it rests directly against the end face 58 of the respective end 22 so an essentially reflection-free transition of the laser radiation from the end surface 48 of the core 42 into the cylindrical body 80 of the GRIN lens is possible. Furthermore, the cylindrical body 80 also has opposite the end face 82 an end face 84 from which the respective collimated laser beam 62 exits in expanded form. The GRIN lenses are also of such dimensions that the diameter $W_{EK}$ of the collimated laser beam 62 corresponds essentially to the diameter of the cylindrical body 80 in order to likewise avoid spaces between individual collimated laser beams 62.

Furthermore, all cylindrical bodies 80 form a coherent unit 170 which is held in a mounting in the same way as illustrated in the first embodiment of the collimating element 30.

Figure 6:
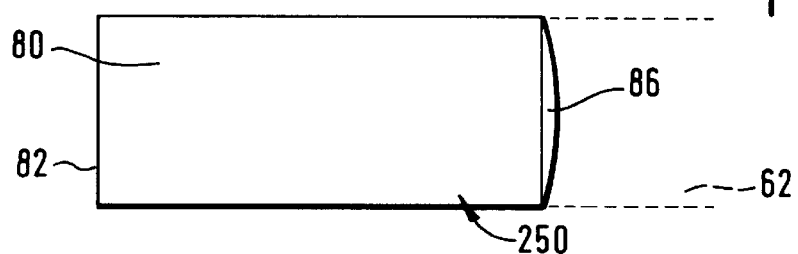
FIG. 6 a single representation of a variant of a single optical element useable in the first or second embodiment of the collimating element.

As illustrated in FIG. 6, it is, however, also possible, with a single optical means 250, to provide a GRIN lens in the cylindrical body 80, but to provide an additional optical lens 86 on the side of the body 80 opposite the end face 82 so that the combined effect of the GRIN lens formed by the cylindrical body 80 and the additional optical lens 86 generates the collimated laser beam 62. Herein, lens errors can be advantageously compensated by the optical lens 86 in combination with the GRIN lens effect in the cylindrical body 80.

Figure 7:
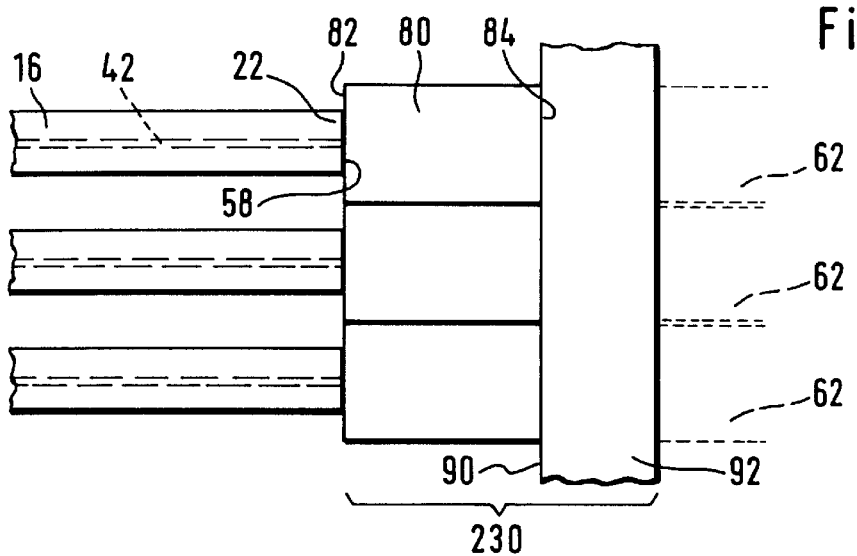
FIG. 7 a representation, similar to FIG. 2, of a third embodiment of a collimating element.

In a further embodiment of an inventive collimating element 230, illustrated in FIG. 7, a GRIN lens described hereinabove and provided in the cylindrical body 80 adjoins the end face 58 of each end 22 of each single-mode fiber 16, and the cylindrical bodies 80 of the GRIN lenses are not joined to one another at their circumferences but are seated with their end face 84 on a surface 90 of a carrier plate 92 and are firmly connected thereto. The carrier plate 92 constitutes a common stabilizing element for all cylindrical bodies 80 of the GRIN lenses and thus fixes these and, in addition, via the GRIN lenses, the ends 22 of the individual single-mode fibers 16 contacting the end faces 82 of the GRIN lenses. With this carrier plate 92, for example, the collimating element 230 can then be mechanically positioned exactly relative to the focusing element 34 in a simple way.

Figure 8:
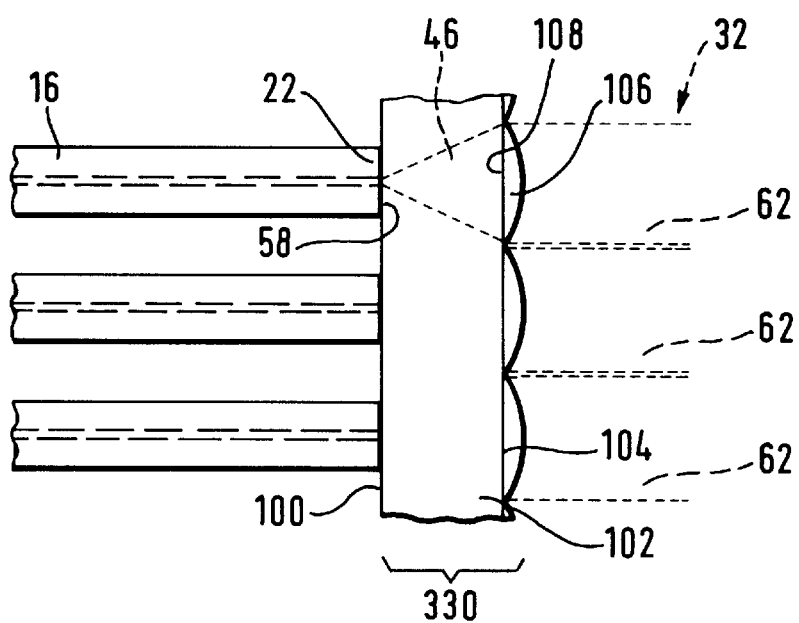
FIG. 8 a representation, similar to FIG. 2, of a fourth embodiment of a collimating element.

In a further embodiment, illustrated in FIG. 8, the single-mode fibers 16 directly contact a surface 100 of a carrier plate 102 with their end faces 58 and are exactly positioned by the surface 100 of the carrier plate 102 and fixed on the carrier plate 102. The carrier plate 102 thus allows fixing of the ends 22 of all single-mode fibers in a defined manner relative to one another and also relative to the collimating element 330. The collimating element 330 is formed not only by the carrier plate 102 but also by optical lenses 106 seated on this carrier plate 102 on a surface 104 opposite the surface 100. The optical lenses 106 have a plane base surface 108 with which they are joined in an essentially reflection-free manner to the carrier plate 102 on the surface 104 thereof.

The spacing between the surfaces 100 and 104 of the carrier plate 102 is selected such that the divergent radiation cone 46 expands in the carrier plate 102 to the extent that its diameter corresponds to the diameter of the plane surface 108 of the optical lens 106 so the optical lens 106 is, in turn, able to generate collimated laser beams 62 extending in the collimated radiation bundle 32 and thereby essentially touching one another.

Figure 9:
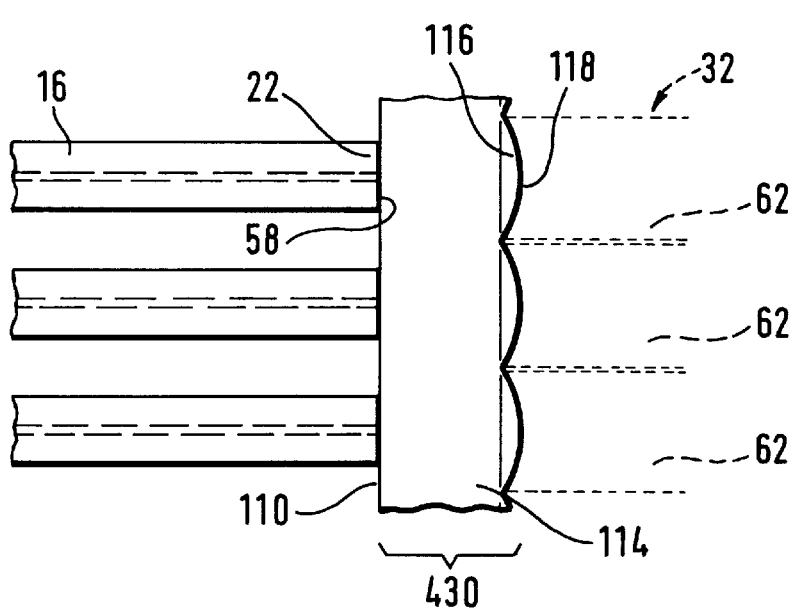
FIG. 9 a representation, similar to FIG. 2, of a fifth embodiment of a collimating element.

In a further embodiment of a collimating element 430, illustrated in FIG. 9, the carrier plate 114 is provided on one side thereof with a plane surface 110 which the ends 22 of all single-mode fibers 16 contact with their end faces 58 and on which they are fixed, for example, with adhesive, while a surface opposite the surface 110 has areas 116 with spherical-cap-shaped surfaces 118 so the areas 116 act in the same way as the optical lenses 106, but are an integral component of the carrier plate 114.

If, taking into consideration the index of refraction, the lens-shaped areas 116 and the curvatures of the spherical-cap-shaped surface areas 118 are designed as in the embodiment according to FIG. 8, collimated laser beams 62 which essentially touch one another in the collimated radiation bundle 32 can similarly be generated.

What is claimed is:

1. A laser system, comprising:
several laser radiation sources, each of which generates laser radiation which is coupled into a first end of a respective single-mode optical fiber,
said respective single-mode optical fibers forming a fiber bundle and having second ends lying at a fiber bundle end, said laser radiation exiting from said second ends and thereby forming a total laser radiation field, and
an optical transformation means which transforms the total laser radiation field onto an object, wherein:
said optical transformation means comprises a collimating element which collimates said laser radiation exiting divergently from each individual second end of said single-mode fibers and forms a collimated radiation bundle therefrom,
said collimating element comprises a different collimating optical means for the second end of each single-mode fiber,
each of said collimating optical means is formed by continuation of the single-mode fiber without a core, and
said optical transformation means further comprises a focusing element which images said collimated radiation bundle as a whole onto a focal point.

2. A laser system as defined in claim 1, wherein:
all laser beams forming said collimated radiation bundle have essentially the same diameter ($W_{EK}$) and essentially the same divergence ($\theta_{EK}$).

3. A laser system as defined in claim 1, wherein:
said collimating optical means comprises an optical lens.

4. A laser system as defined in claim 1, wherein:
said collimating optical means comprises a GRIN optical means or a diffractive optical means.

5. A laser system as defined in claim 1, wherein:
said collimating optical means comprises a combined optical means comprising of at least one of an optical lens, a GRIN optical means, and a diffractive optical means.

6. A laser system as defined in claim 1, wherein:
said collimating optical means generates a collimated laser beam, the diameter ($W_{EK}$) of which corresponds essentially to an outer diameter of said respective collimating optical means.

7. A laser system as defined in claim 1, wherein:
each collimating optical means comprises a single optical element.

8. A laser system as defined in claim 7, wherein:
said single optical elements rest against one another in the area of their outer contour.

9. A laser system as defined in claim 7, wherein:
said single optical elements are arranged in a highly dense, hexagonal package in one plane.

10. A laser system, comprising:
several laser radiation sources, each of which generates laser radiation which is coupled into a first end of a respective single-mode optical fiber,
said respective single-mode optical fibers forming a fiber bundle and having second ends lying at a fiber bundle end, laid laser radiation exiting from said second ends and thereby forming a total laser radiation field, and
an optical transformation means which transforms the total laser radiation field onto an object, wherein:
said optical transformation means comprises a collimating element which collimates said laser radiation exiting divergently from each individual second end of said single-mode fibers and forms a collimated radiation bundle therefrom,
said second ends of said optical single-mode fibers rest with an end face against said collimating element,
said collimating element comprises a carrier,
said carrier comprises a one-piece, light-permeable plate,
said collimating element comprises a different collimating optical means for the second end of each single-mode fiber,
a transition from said collimating optical means to said carrier occurs in an essentially reflection-free manner, and
said optical transformation means further comprises a focusing element which images said collimated radiation bundle as a whole onto a focal point.

11. A laser system as defined in claim 10, wherein:
said collimating element is fixedly connected to each individual single-mode fiber.

12. A laser system as defined in claim 10, wherein:
said second ends of said single-mode fibers rest with their end face against said carrier means.

13. A laser system as defined in claim 10, wherein:
said second ends of said single-mode fibers rest with their end faces against an end face of said single optical elements, and said single optical elements rest with the other end face against said carrier means.

14. A laser system as defined in claim 10, wherein:

said collimating element is of one-piece design and forms for each second end a collimating optical means of its own.

15. A laser system as defined in claim 10, wherein:

said carrier means extends over an entire cross section of said collimated radiation bundle.

16. A laser system as defined in claim 15, wherein:

said one-piece, light-permeable plate positions said single optical elements in a defined manner relative to one another.

17. A laser system as defined in claim 16, wherein:

said single optical elements rest with their end face against said carrier means.

18. A laser system as defined in claim 16, wherein:

said carrier means carries said single optical elements.

19. A laser system as defined in claim 10, wherein:

said collimating element is formed by a plurality of single optical elements connected to one another.

20. A laser system as defined in claim 19, wherein:

said single optical elements are connected to one another in the area of their outer contour.

21. A laser system as defined in claim 19, wherein:

said second ends of said single-mode fibers rest with their end faces against an end face of said single optical elements.

22. A laser system, comprising:

several laser radiation sources, each of which generates laser radiation which is coupled into a first end of a respective single-mode optical fiber, said respective single-mode optical fibers forming a fiber bundle and having second ends lying at a fiber bundle end, said laser radiation exiting from said second ends and thereby forming a total laser radiation field, and an optical transformation means which transforms the total laser radiation field onto an object, wherein:

said optical transformation means comprises a collimating element which collimates said laser radiation exiting divergently from each individual second end of said single-mode fibers and forms a collimated radiation bundle therefrom, said collimating element is formed by a lens array having a plurality of lenses, each of said lenses is formed by continuation of the single-mode fiber without a core, each of said lenses comprising at least one of a GRIN lens and a diffractive optical lens resulting in an essentially reflection-free transition of the radiation occurring from the single-mode fiber to the lenses, and said optical transformation means further comprises a focusing element which images said collimated radiation bundle as a whole onto a focal point.

23. A laser system, comprising:

several laser radiation sources, each of which generates laser radiation which is coupled into a first end of a respective single-mode optical fiber, said respective single-mode optical fibers forming a fiber bundle and having second ends lying at a fiber bundle end, said laser radiation exiting from said second ends and thereby forming a total laser radiation field, and an optical transformation means which transforms the total laser radiation field onto an object, wherein:

said optical transformation means comprises a collimating element which collimates said laser radiation exiting divergently from each individual second end of said single-mode fibers and forms a collimated radiation bundle therefrom, said collimating element is formed by a lens array, wherein said lens array comprises an individual lens for each second end of said optical single-mode fiber, which individually collimates said laser radiation exiting divergently from each individual second end, said lens array is arranged on a carrier, said carrier comprises a one-piece, light-permeable plate, the transition from said fiber bundle to said plate occurs in an essentially reflection-free manner, and said optical transformation means further comprises a focusing element which images said collimated radiation bundle as a whole onto a focal point.

24. A laser system as defined in claim 23, wherein:

said second end of each single-mode fiber rests with an end face against said collimating element.

25. A laser system, comprising:

several laser radiation sources, each of which generates laser radiation which is coupled into a first end of a respective single-mode optical fiber, said respective single-mode optical fibers forming a fiber bundle and having second ends lying at a fiber bundle end, said laser radiation exiting from said second ends and thereby forming a total laser radiation field, and an optical transformation means which transforms the total laser radiation field onto an object, wherein:

said optical transformation means comprises a collimating element which collimates said laser radiation exiting divergently from each individual second end of said single-mode fibers and forms a collimated radiation bundle therefrom, said collimating element is formed by a lens array, said lens array comprises an individual GRIN lens combined with an optical diffractive lens for each second end of said optical single-mode fiber, which individually collimates said laser radiation exiting divergently from each individual second end, said lens array is arranged on a carrier, said carrier comprises a one-piece, light-permeable plate, the transition from said fiber bundle to said plate occurs in an essentially reflection-free manner, and said optical transformation means further comprises a focusing element which images said collimated radiation bundle as a whole onto a focal point.

* * * * *